(12) United States Patent
Usujima et al.

(10) Patent No.: US 8,907,430 B2
(45) Date of Patent: Dec. 9, 2014

(54) SEMICONDUCTOR DEVICE AND MANUFACTURING METHOD OF SEMICONDUCTOR DEVICE

(75) Inventors: Akihiro Usujima, Kawasaki (JP); Junichi Ariyoshi, Kawasaki (JP); Taiji Ema, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 559 days.

(21) Appl. No.: 12/599,431

(22) Filed: Nov. 9, 2009

(65) Prior Publication Data

US 2010/0308420 A1 Dec. 9, 2010

Related U.S. Application Data

(63) Continuation of application No. PCT/JP2007/064998, filed on Jul. 31, 2007.

(51) Int. Cl.
| | |
|---|---|
| H01L 27/088 | (2006.01) |
| H01L 27/115 | (2006.01) |
| H01L 21/28 | (2006.01) |
| H01L 21/8234 | (2006.01) |
| H01L 27/105 | (2006.01) |
| H01L 29/788 | (2006.01) |

(52) U.S. Cl.
CPC .... *H01L 27/11526* (2013.01); *H01L 21/28273* (2013.01); *H01L 21/823418* (2013.01); *H01L 21/823456* (2013.01); *H01L 21/823462* (2013.01); *H01L 21/823468* (2013.01); *H01L 27/105* (2013.01); *H01L 27/11546* (2013.01); *H01L 29/7881* (2013.01)
USPC .......................... 257/401; 257/316; 257/E29.17

(58) Field of Classification Search
USPC ..................................... 257/316, 401, E29.17
See application file for complete search history.

(56) References Cited

U.S. PATENT DOCUMENTS

| | | | |
|---|---|---|---|
| 7,118,972 B2 | 10/2006 | Shinohara et al. | |
| 2003/0011017 A1* | 1/2003 | Lee et al. | 257/314 |

(Continued)

FOREIGN PATENT DOCUMENTS

| | | |
|---|---|---|
| JP | 2001-093984 A | 4/2001 |
| JP | 2003-124338 A | 4/2003 |

(Continued)

OTHER PUBLICATIONS

International Search Report of PCT/JP2007/064998, mailing date of Oct. 23, 2007.

*Primary Examiner* — Zandra Smith
*Assistant Examiner* — Jamie C Niesz
(74) *Attorney, Agent, or Firm* — Westerman, Hattori, Daniels & Adrian, LLP

(57) ABSTRACT

A semiconductor device includes a memory transistor including a first side wall insulating film and a second side wall insulating film disposed on the outside; a high-voltage transistor including a third side wall insulating film having the same composition as that of the first side wall insulating film, and a fourth side wall insulating film having the same composition as that of the second side wall insulating film, the fourth side wall insulating film being disposed on the outside; and a low-voltage transistor including a fifth side wall insulating film having the same composition as that of the second and fourth side wall insulating films. The memory transistor, the high-voltage transistor, and the low-voltage transistor are disposed on the same substrate. A total side wall spacer width of the low-voltage transistor is smaller than that of the high-voltage transistor by a thickness corresponding to the third side wall insulating film.

3 Claims, 16 Drawing Sheets

(56) References Cited

U.S. PATENT DOCUMENTS

2004/0229437 A1* 11/2004 Tseng et al. ............... 438/265
2006/0214256 A1* 9/2006 Shinohara et al. ........... 257/500
2006/0226469 A1 10/2006 Nakagawa
2007/0166937 A1* 7/2007 Adetutu et al. ............. 438/300
2008/0028521 A1* 2/2008 Mehta ............................ 5/491
2008/0142871 A1* 6/2008 Anezaki ..................... 257/321

FOREIGN PATENT DOCUMENTS

| JP | 2004-349680 A | | 12/2004 | |
| JP | WO 2005/041307 | * | 5/2005 | ............. H01L 29/78 |
| JP | 2006-286675 A | | 10/2006 | |
| KR | JP 10-2006-0029376 | * | 4/2006 | ............ H01L 27/115 |
| WO | 2005/041307 A1 | | 5/2005 | |

* cited by examiner (FLASH)  (HVTr)  (LVTr)

(FLASH)  (HVTr)  (LVTr)

SEMICONDUCTOR DEVICE AND MANUFACTURING METHOD OF SEMICONDUCTOR DEVICE

CROSS-REFERENCE TO RELATED APPLICATIONS

This patent application is based upon and claims the benefit of priority under 35 USC 120 and 365(c) of PCT application JP2007/064998 filed in Japan on Jul. 31, 2007, the entire contents of which are incorporated herein by reference.

FIELD

The embodiments discussed herein are related to a semiconductor device and a manufacturing method of the semiconductor device.

BACKGROUND

In recent years, a semiconductor device, in which a nonvolatile memory cell array and a logic circuit for operating at high-speed are mounted on the same chip, have been in practical use. The logic circuit for performing high-speed processing is applied to, for example, a CPU or a ROM, and is operated at a low voltage to increase the carrier mobility. Meanwhile, a transistor used as the storage for the nonvolatile memory and a transistor used for selecting memory cells are constituted by high voltage transistors. Furthermore, analog circuits such as the amplifying circuit, the transmission circuit, and the power source circuit are also constituted by high voltage transistors.

The following problem arises when a side wall (hereinafter, simply referred to as "side wall" or "SW") spacer of a low voltage transistor and a side wall (SW) of a high voltage transistor are fabricated substantially simultaneously in a single process by the same procedure. As illustrated in FIG. 1, a low voltage transistor LVTr is miniaturized for the purpose of implementing high-speed switching operations. If a side wall 110 of the high voltage transistor HVTr has the same width as the side wall (SW) of the low voltage transistor LVTr, a length d in the high voltage transistor HVTr is reduced. Specifically, the length d is the length between the leading edge of a source/drain extension 106, which is a low-concentration diffusion layer, and the leading edge of a source/drain 108, which is a high-concentration diffusion layer. As a result, the concentration profile becomes steep near the junction on the drain side, and the generation efficiency of impact ionization is enhanced. Accordingly, as illustrated in FIG. 2, the junction withstand voltage and the snapback withstand voltage on the drain side are decreased.

Impact ionization is a phenomenon in which the gate current and the source/drain current rapidly increase when an electron is accelerated to a high-energy state by a high electrical field and collides with an electron in a valence band, and an electron-hole pair is formed. As illustrated in FIG. 2, when the breakdown voltage of the high voltage transistor HVTr, which is the standard voltage, is greater than or equal to 10 V, the voltage BVds at which snapback occurs (breakdown voltage between source and drain) decreases to less than 10 V, due to the narrow SW width. As illustrated in the example of FIG. 1, the side wall 110 in both the high voltage transistor HVTr and the low voltage transistor LVTr has a two-layered structure including an oxide film 110A and a nitride film 110B. The same problem as described above arises when the side wall 110 has a single-layered structure or a three-layered structure, as long as the side walls on the high-voltage operation side and the low-voltage operation side have the same structure.

In order to solve the above problem, a technology as illustrated in FIG. 3 has been proposed. Specifically, the side walls of a memory transistor and a high voltage transistor HVTr have the same structure. These side walls have a larger width than that of the side wall of the low voltage transistor LVTr (see, for example, patent document 1).

In patent document 1, three types of transistors are disposed at predetermined positions on a silicon substrate 201. On each of the poly-gate electrodes 205, 215, and 225 of the transistors, a first oxide film 210A, a first nitride film 210B, and a second oxide film 220 are sequentially formed by a low-temperature, low-pressure CVD method. The temperatures at which the first oxide film 210A, the first nitride film 210B, and the second oxide film 220 are formed (film forming temperature) are 640° C., 700° C., and 640° C., respectively. Subsequently, only in the low voltage transistor LVTr, the second oxide film 220 is removed by a wet etching method. Then, a dry etching method is performed to etch back the SW films of all of the transistors. Accordingly, the memory transistor and the high voltage transistor HVTr have a two-layered structure including a first side wall 210 and a second side wall (second oxide film) 220 positioned outside the first side wall 210, while the low voltage transistor LVTr has only the first side wall 210. Forming the three types of SW films at a low temperature prevents degrading (Ids degradation) of the electric properties of the low voltage transistor LVTr.

In the example illustrated in FIG. 3, the memory transistor is a floating gate type transistor including a tunnel insulating film 202, a floating gate 203, an ONO (oxide-nitride-oxide) film 204, and a control gate 205. The high voltage transistor HVTr and the low voltage transistor LVTr are field-effect transistors including gate electrodes 215 and 225 that are provided on the same substrate 201 via gate insulating films 212 and 222, respectively.

Patent document 1: Japanese Laid-Open Patent Application No. 2004-349680

In patent document 1, the SW width of the miniaturized low voltage transistor LVTr is smaller than that of the memory transistor or the high voltage transistor HVTr, and therefore the performance of the low voltage transistor LVTr is improved. However, when the three types of transistors are formed at once, all of the first side walls 210 in contact with side walls of the gate electrodes (including laminated gate electrode) is formed at a low temperature, in accordance with the temperature for forming the low voltage transistor LVTr. Accordingly, it is difficult to ensure data saving properties.

SUMMARY

According to an aspect of the invention, a semiconductor device includes a first transistor including a first gate side wall insulating film and a second gate side wall insulating film disposed outside of the first gate side wall insulating film; a second transistor including a third gate side wall insulating film that has the same composition as that of the first gate side wall insulating film, and a fourth gate side wall insulating film that has the same composition as that of the second gate side wall insulating film, the fourth gate side wall insulating film being disposed outside of the third gate side wall insulating film; and a third transistor including a fifth gate side wall insulating film that has the same composition as that of the second gate side wall insulating film and the fourth gate side wall insulating film. A total side wall spacer width of the third operation transistor is smaller than that of the second transistor by a thickness corresponding to the third gate side wall insulating film.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings.

Figure 4:
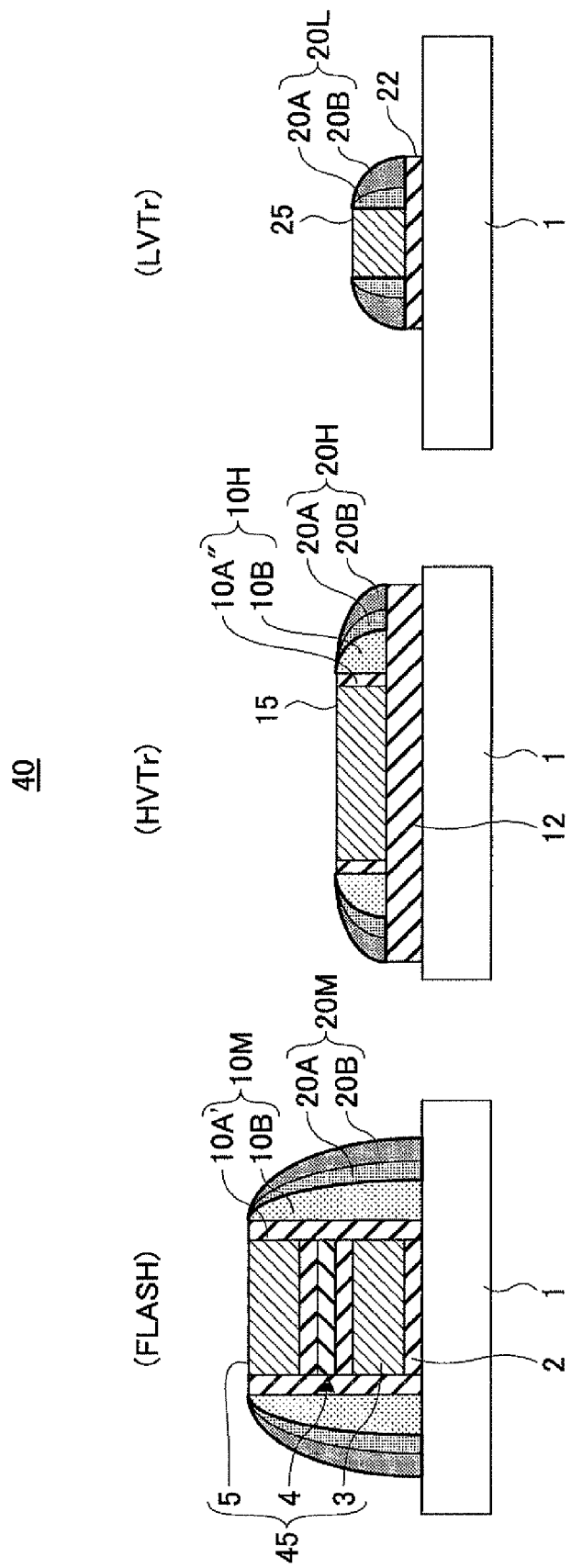
FIG. 4 illustrates the basic structure of a semiconductor device according to an embodiment of the present invention.

FIG. 4 is a schematic cross-sectional view of a configuration example of a semiconductor device 40 according to an embodiment of the present invention. The semiconductor device 40 includes a memory transistor, a high voltage (high-voltage operation) transistor HVTr, and a low voltage (low-voltage operation) transistor LVTr.

The memory transistor is a transistor (Flash) that is used in, for example, a nonvolatile flash memory. The transistor (Flash) includes a laminated gate electrode (flash gate) 45 formed by sequentially laminating a floating gate 3, an ONO (oxide-nitride-oxide) film 4, and a control gate 5, on a silicon substrate 1 via a tunnel insulating film 2. A first side wall (gate side wall insulating film) 10M is provided on the side wall of the flash gate 45, and a second side wall (gate side wall insulating film) 20M is provided outside the first side wall 10M. The first side wall 10M has a film structure having a higher density than the second side wall 20M. The first side wall 10M is constituted by, for example, a thermally-oxidized film 10A' and a CVD-nitride film 10B. The second side wall 20M is constituted by, for example, a CVD-TEOS (tetra-ethyl ortho-silicate) film 20A and a low-temperature CVD-nitride film 20B. The first side wall 10M and the second side wall 20M constitute a side wall spacer of the flash gate 45.

The high voltage transistor HVTr has the same side wall structure as that of the memory transistor (Flash). On the side wall of a gate electrode 15 disposed on the silicon substrate 1 via a gate insulating film 12, there is provided a first side wall 10H having a high density. A second side wall 20H is provided outside the first side wall 10H. The first side wall 10H is constituted by a thermally-oxidized film 10A" and the CVD-nitride film 10B. The second side wall 20H is constituted by the CVD-TEOS film 20A and the low-temperature CVD-nitride film 20B. The first side wall 10H and the second side wall 20H constitute a gate side wall spacer of the high voltage transistor HVTr.

In the low voltage transistor LVTr, a second side wall 20L, which has the same thickness and the same composition as that of the second side wall of the memory transistor (Flash) and the high voltage transistor HVTr, is provided on the side wall of a gate electrode 25. In this example, the gate side wall spacer of the low voltage transistor LVTr is constituted only by the second side wall 20L. The gate side wall spacer of the low voltage transistor LVTr has a spacer width that is smaller than that of the gate side wall spacer of the high voltage transistor HVTr by a thickness of the first side wall 10H.

The semiconductor device 40 is described below in detail. First, the flash gate 45 of the memory transistor (Flash) and the gate electrode 15 of the high voltage transistor HVTr are formed. Then, the thermally-oxidized films 10A' and 10A" and the CVD-nitride films 10B are formed at a high temperature (for example, 880° C. through 1000° C. and 780° C. through 900° C., respectively), thereby forming insulating films having a high density. Then, a dry etching method is performed to etch back the insulating films. Accordingly, the inner SW (first side walls) 10M and 10H having good memory data saving properties and high mechanical strength are formed substantially simultaneously in a single process. Then, the gate electrode 25 of the low voltage transistor LVTr is formed. Then, on all three types of transistors, the CVD-TEOS film 20A and the low-temperature CVD-nitride film 20B are formed at temperatures of 600° C. through 670° C. and 630° C. through 700° C., respectively. Then, these films are etched back, so that the second side walls 20M, 20H, and 20L are formed substantially simultaneously in a single process. Accordingly, the electric properties of the miniaturized low voltage transistor LVTr are maintained, while the memory transistor (Flash) and the high voltage transistor HVTr have side walls with a sufficient width.

Figure 5:
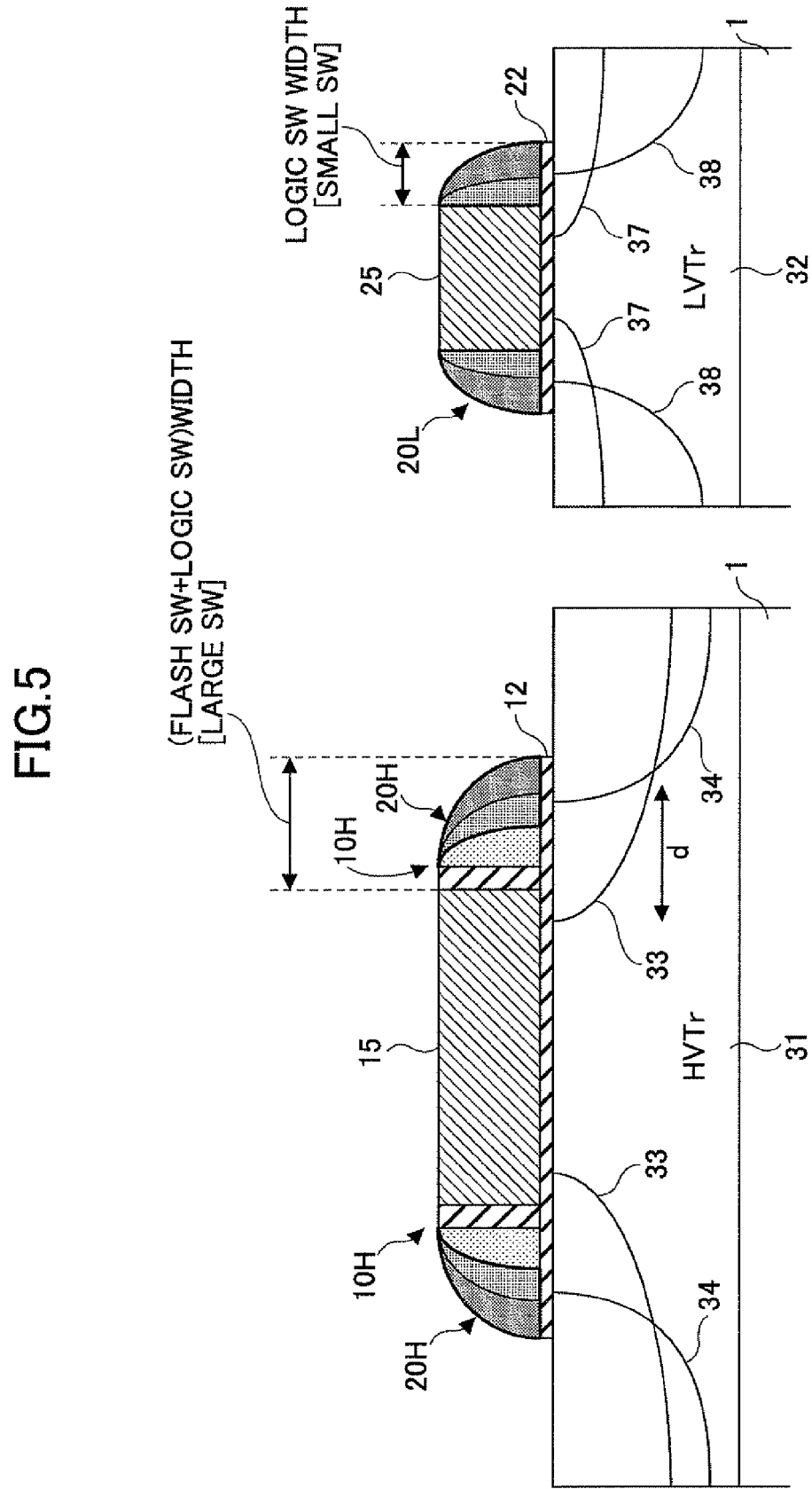
FIG. 5 illustrates configurations of the high voltage transistor HVTr and the low voltage transistor LVTr illustrated according to an embodiment of the present invention.

FIG. 5 illustrates configurations of the high voltage transistor HVTr and the low voltage transistor LVTr illustrated in FIG. 4. The high voltage transistor HVTr has a large spacer width (SW width), which corresponds to the total width of the first side wall 10H on the inside (flash SW width) and the second side wall 20H on the outside (logic SW width). The position of the leading edge of a source/drain impurity diffused layer 34, which is formed in a well 31 in the silicon substrate 1, is spaced away from the leading edge of a source/drain extension 33 by a length d (from the position immediately below the channel). Thus, the impurity density of the source/drain extension 33 has a moderate tilt in the horizontal direction. Accordingly, generation of impact ions is reduced, and the junction withstand voltage and the snapback withstand voltage on the drain side are increased.

Meanwhile, the low voltage transistor LVTr has a small spacer width (SW width) corresponding to the width of the second side wall 20L, for the purpose of miniaturization. The density profile of a source/drain impurity diffused layer 38 with respect to a source/drain extension 37 formed in a well 32 is determined by the SW width of the second side wall 20L, and therefore the low voltage transistor LVTr operates in accordance with the miniaturized structure.

Figure 6A:
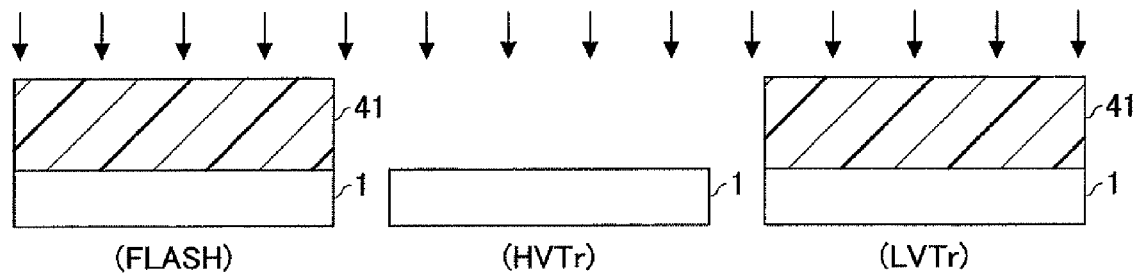
FIGS. 6A through 6Q illustrate a manufacturing process of a semiconductor device according to an embodiment of the present invention.
Figure 6B:
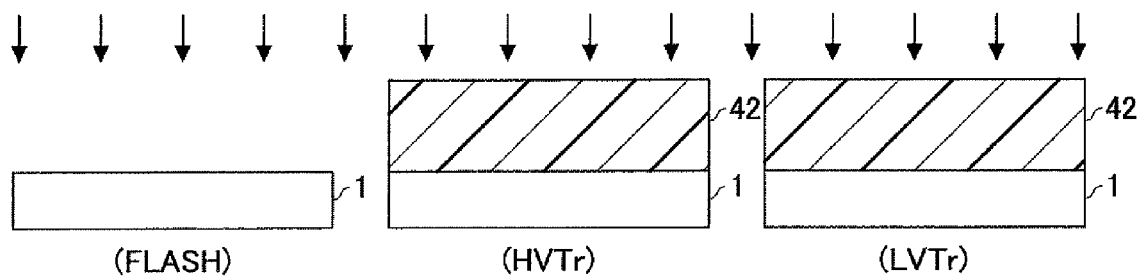
Figure 6C:
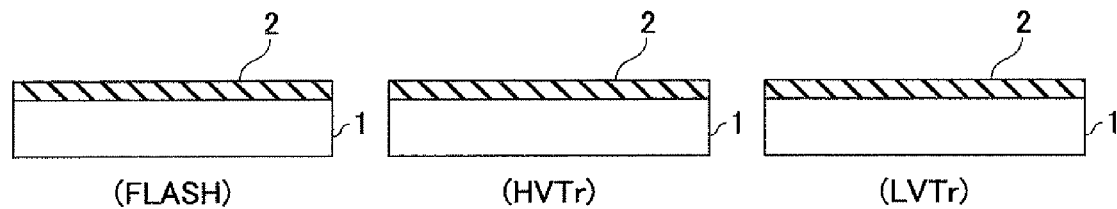
Figure 6D:
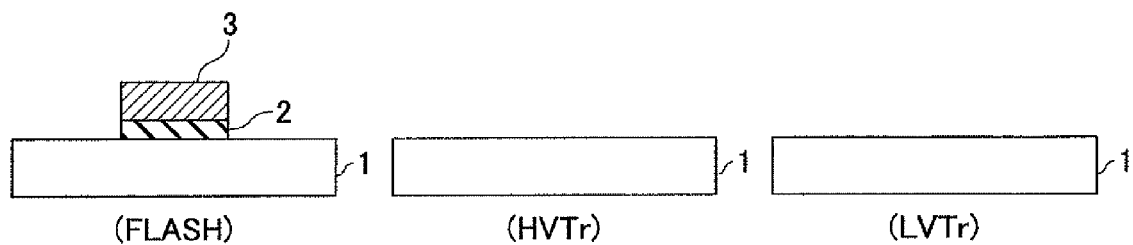
Figure 6E:
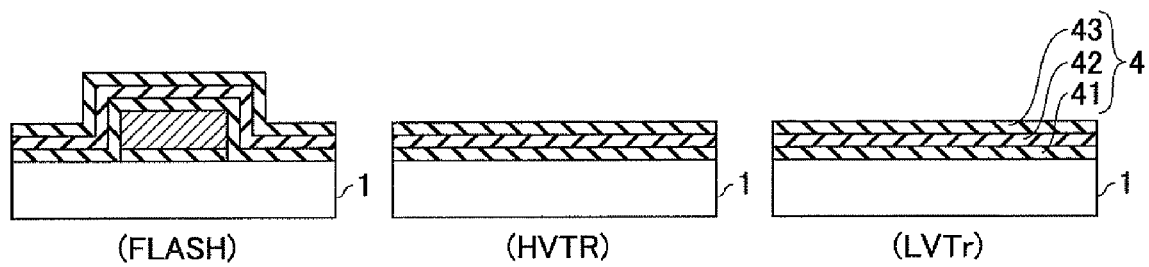
Figure 6F:
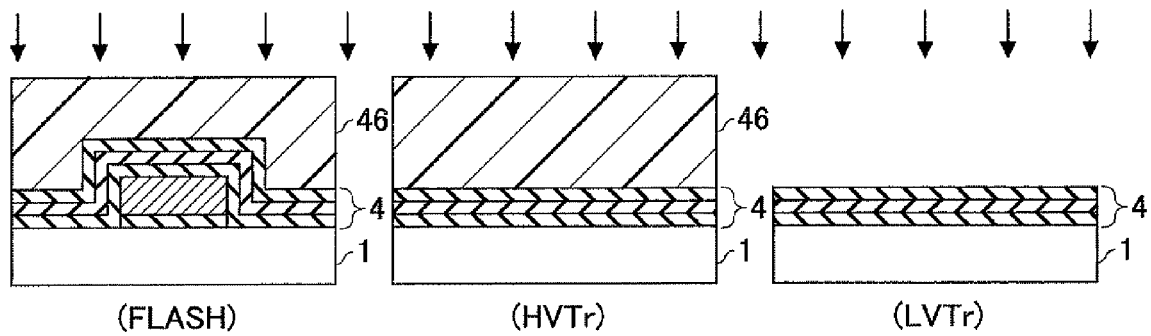
Figure 6G:
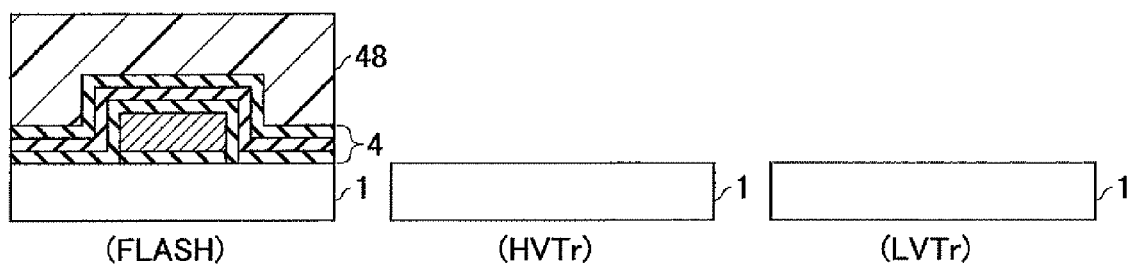
Figure 6H:
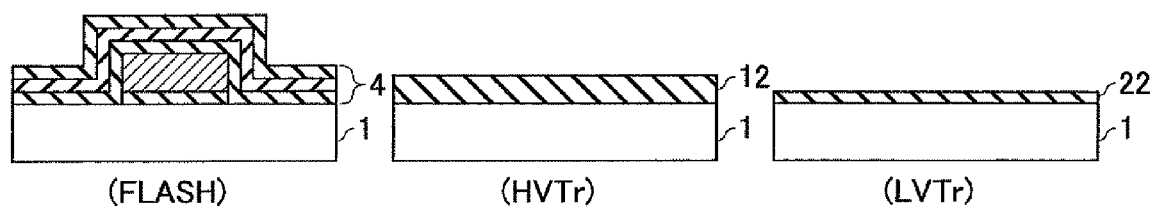
Figure 6I:
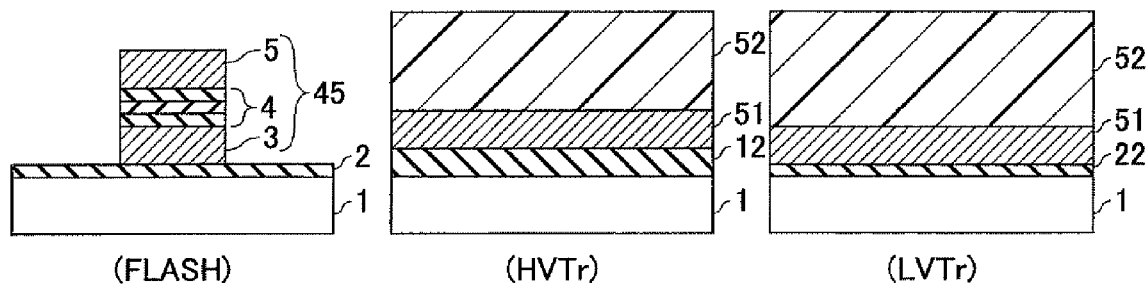
Figure 6J:
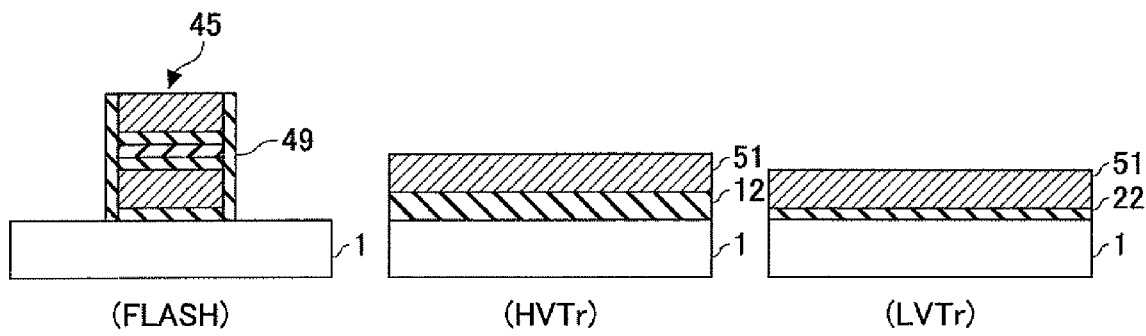
Figure 6K:
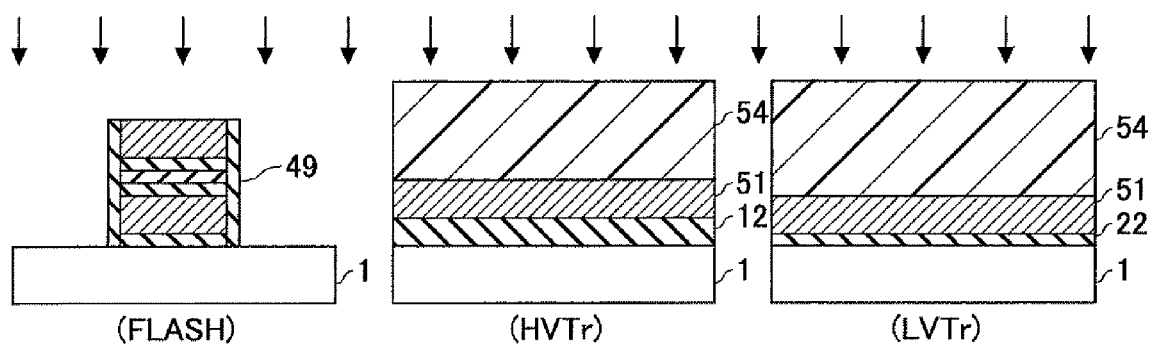
Figure 6L:
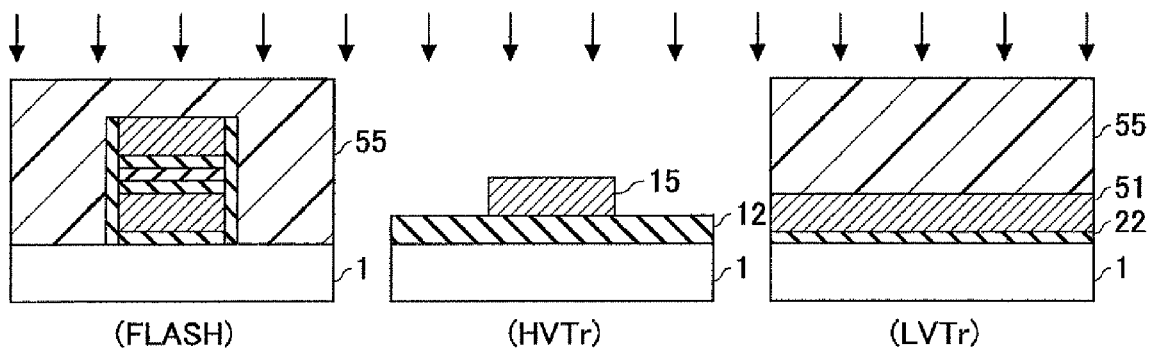
Figure 6M:
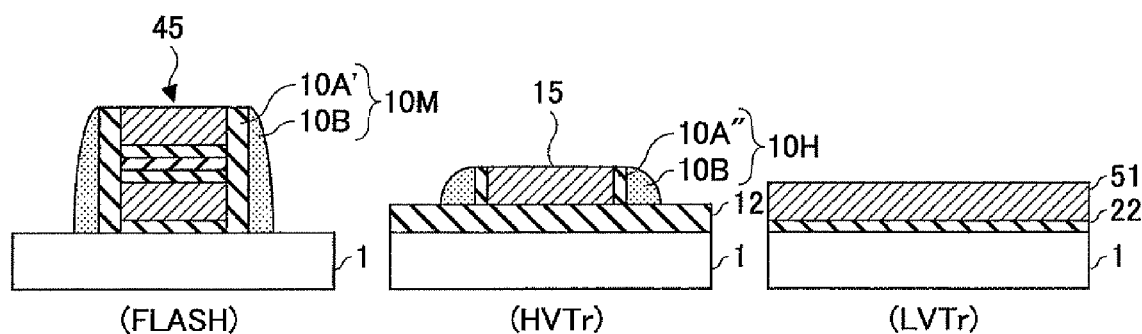
Figure 6N:
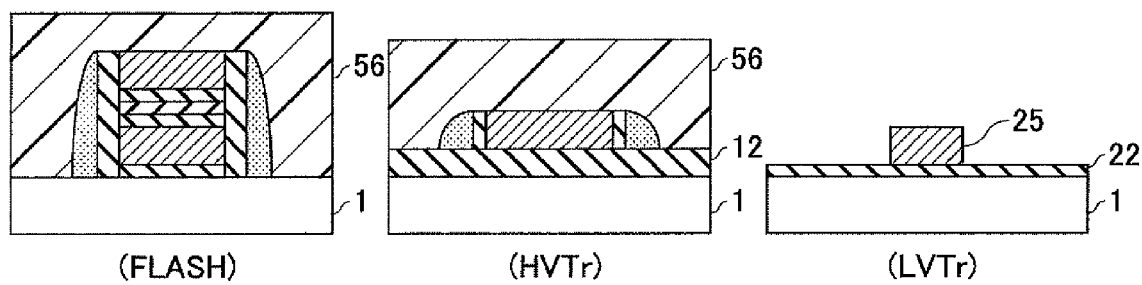
Figure 6O:
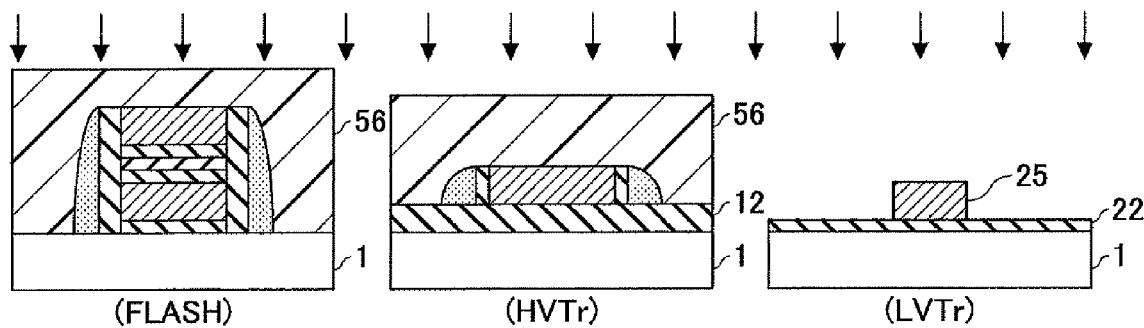
Figure 6P:
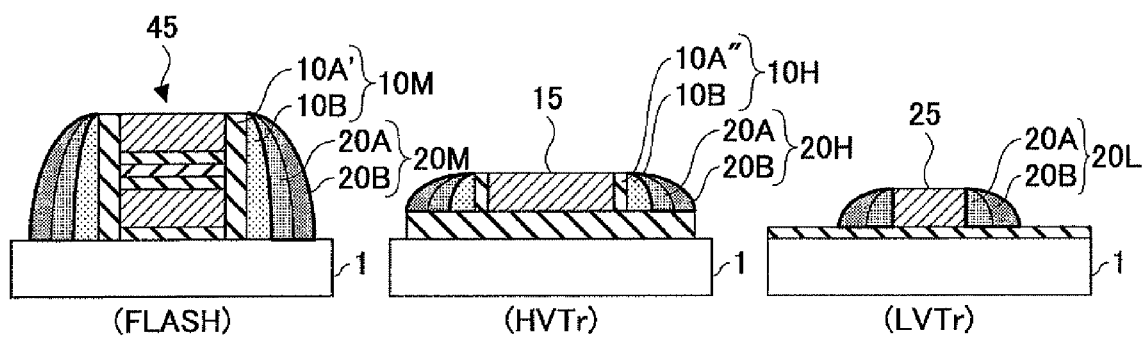
Figure 6Q:
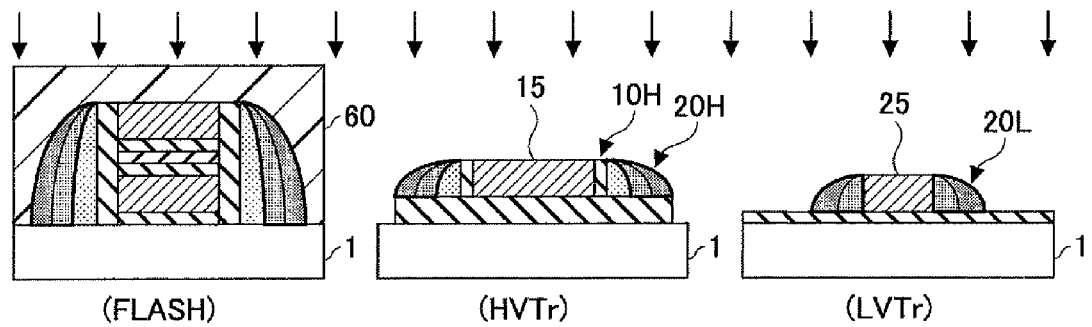

FIGS. 6A through 6Q illustrate a manufacturing process of the semiconductor device 40 illustrated in FIG. 4. First, as illustrated in FIG. 6A, resist 41 is applied on the whole surface of the silicon substrate 1 on which a device isolation region (not illustrated) and a well region of a predetermined conductivity type (not illustrated) are formed. Then, only a region corresponding to the high voltage transistor HVTr is exposed, and channel ions for the high voltage transistor HVTr are implanted. For example, the implanting conditions are that boron (B) is implanted by 200 keV, 2E13 cm$^{-2}$ in the case of NMOS, and phosphorus (P) is implanted by 400 keV, 8E12 cm$^{-2}$ in the case of PMOS.

Next, as illustrated in FIG. 6B, the resist 41 is removed, and new resist 42 is applied. Only a region corresponding to the memory transistor (Flash) is exposed, and channel ions for the memory transistor (Flash) are implanted. For example, boron (B) is implanted by 50 keV, 7E13 cm$^{-2}$.

Next, as illustrated in FIG. 6C, the resist 42 is removed, and a thermally-oxidized film (SiO2 film) 2 having a thickness of 10 nm is formed on the whole surface of the semiconductor device 40 at 1100° C. The thermally-oxidized film becomes the tunnel insulating film 2 of the memory transistor (Flash).

Next, as illustrated in FIG. 6D, a doped polysilicon film having a thickness of 100 nm is formed on the tunnel insulating film 2. The film is formed at a temperature of, for example, 540° C., and is doped in phosphorus (P) ions at a doping density of 5E19 cm$^3$. By performing a photolithography method and an etching method, the polysilicon film and the thermally-oxidized film 2 are patterned into a predetermined shape, and the floating gate 3 of the memory transistor (Flash) is formed.

Next, as illustrated in FIG. 6E, the ONO film 4 is formed on the whole surface of the semiconductor device 40. For example, the ONO film 4 is formed by forming a silicon oxide film (SiO2) 41 having a thickness of 6 nm by a CVD method, and then forming a silicon nitride film (SiN) 42 having a thickness of 8 nm on the silicon oxide film (SiO2) 41 by a CVD method, and then forming a silicon oxide film (SiO2) 43 having a thickness of 250 nm on the silicon nitride film (SiN) 42.

Next, as illustrated in FIG. 6F, resist 46 is formed on the whole surface of the semiconductor device 40. Then, only a region corresponding to the low voltage transistor LVTr is exposed, and channel ions for the low voltage transistor LVTr are implanted through the ONO film 4. For example, the implanting conditions are that boron (B) is implanted by 10 keV, 4E13 cm$^{-2}$ in the case of NMOS, and arsenic (As) is implanted by 100 keV, 2E13 cm$^{-2}$ in the case of PMOS.

Next, as illustrated in FIG. 6G, the region corresponding to the memory transistor (Flash) is covered by a mask 48, and the ONO film 4 is removed from the regions corresponding to the high voltage transistor HVTr and the low voltage transistor LVTr by a dry etching method.

Next, as illustrated in FIG. 6H, in both the high voltage transistor HVTr and the low voltage transistor LVTr, a wet oxide method is performed to form the gate oxidized films 12 and 22, respectively. In the region corresponding to the high voltage transistor HVTr, the gate oxidized film 12 having a thickness of 16 nm is formed at an oxidizing temperature of 900° C. In the region corresponding to the low voltage transistor LVTr, the gate oxidized film 22 having a thickness of 2 nm is formed at an oxidizing temperature of 900° C. The gate oxidized films 12 and 22 become the gate insulating films 12 and 22, respectively.

Next, as illustrated in FIG. 6I, a polysilicon film 51 having a thickness of 110 nm is formed on the whole surface of the semiconductor device 40. The regions corresponding to the high voltage transistor HVTr and the low voltage transistor LVTr are covered by a mask 52. The polysilicon film 51 and the ONO film 4 in the Flash region are processed by performing a photolithography method and an etching method, so as to form the flash gate (laminated gate electrode) 45 including the control gate 5, the ONO film 4 serving as an interlayer capacitance film, and the floating gate 3.

Next, as illustrated in FIG. 6J, a screen oxidized film 49 used when implanting ions is formed on the side walls of the flash gate 45. The screen oxidized film (flash gate side wall oxidized film) 49 is formed by thermal oxidation at, for example, 900° C., to have a thickness of 5 nm through 11 nm.

Next, as illustrated in FIG. 6K, the regions corresponding to the high voltage transistor HVTr and the low voltage transistor LVTr are covered by a mask 54. Ions for the source/drain extension are implanted into the flash region. For example, the ion implantation is performed by implant energy of 40 keV and with a dose amount of 2E14 cm$^{-2}$.

Next, as illustrated in FIG. 6L, the polysilicon film 51 in the high voltage transistor HVTr region is processed to form the gate electrode 15. Then, a mask 55 is formed such that only the high voltage transistor HVTr is exposed, and ions for the source/drain extension of the high voltage transistor HVTr are implanted. For example, the implanting conditions are that phosphorus (P) is implanted by 50 keV, 4E13 cm$^{-2}$ in the case of NMOS, and boron fluoride (BF2) is implanted by 50 keV, 4E13 cm$^{-2}$ in the case of PMOS.

Next, as illustrated in FIG. 6M, the first side walls 10M and 10H are formed on the side walls of the flash gate 45 and the gate electrode 15 of the high voltage transistor HVTr, respectively. Specifically, the mask 55 is removed, and thermal oxidation is performed at 900° C. to form a silicon oxide film having a thickness of 10 nm on the side walls of the flash gate 45 and the gate electrode 15 of the high voltage transistor HVTr. The oxidized film 49 is already formed on the side walls of the flash gate 45, and therefore, after the thermal oxidation procedure, the thermally-oxidized film 10A' formed on the side walls of the flash gate 45 has a larger thickness than that of the thermally-oxidized film 10A'' formed on the side walls of the gate electrode 15 of the high voltage transistor HVTr. Then, the CVD-nitride (SiN) film 10B having a thickness of 73 nm is formed on the whole surfaces of the thermally-oxidized films 10A' and 10A'' at a temperature of 800° C., and the CVD-nitride (SiN) film 10B is etched back. Accordingly, first side walls 10M and 10H having a high density are formed on side walls of the flash gate 45 and the gate electrode 15 of the high voltage transistor HVTr, respectively. The first side walls 10M and 10H having a high density that are formed at a high temperature are effective in terms of improving the retention of the memory transistor (Flash).

Next, as illustrated in FIG. 6N, a mask 56 is formed such that only the region corresponding to the low voltage transistor LVTr is exposed, and the polysilicon film 51 is processed, thereby forming the gate electrode 25 of the low voltage transistor LVTr.

Next, as illustrated in FIG. 6O, the gate electrode 25 is used as a mask for implanting the ions for the source/drain extension of the low voltage transistor LVTr. For example, the implanting conditions are that arsenic (As) is implanted by 4 keV, 1E15 cm$^{-2}$ in the case of NMOS, and boron (B) is implanted by 0.4 keV, 8E14 cm$^{-2}$ in the case of PMOS.

Next, as illustrated in FIG. 6P, the mask 56 is removed, and the second side walls 20M, 20H, and 20L are formed substantially simultaneously in a single process on the memory transistor (Flash), the high voltage transistor HVTr, and the low voltage transistor LVTr. The second side walls 20M, 20H, and 20L are collectively referred to as the "second side wall 20". The second side wall 20 is formed by forming the CVD- TEOS film 20A having a thickness of 30 nm at a temperature of 650° C., and then forming the low-temperature CVD-nitride film 20B having a thickness of 60 nm at a temperature of 680° C. In this example, the total thickness of the second side wall 20 is 90 nm.

In this state, in the memory transistor (Flash) and the high voltage transistor HVTr, the second side wall 20M and the second side wall 20H that have been formed at low temperatures are respectively positioned on the outside of the first side wall 10M having a high density and the first side wall 10H having a high density that have been formed at high temperatures. Thus, the widths of the side walls are sufficient for maintaining an appropriate concentration profile of the source/drain extension region. Meanwhile, in the low voltage transistor LVTr, the second side wall 20L is formed at a low temperature, and therefore the impurities for the source/drain extension that have been implanted in the previous procedure may be prevented from diffusing.

Lastly, as illustrated in FIG. 6Q, ions for the source/drain are implanted to the memory transistor (Flash), the high voltage transistor HVTr, and the low voltage transistor LVTr. Phosphorus (P) is implanted by 7 keV, 9E15 cm$^{-2}$ in the case of NMOS, and boron (B) is implanted by 5 keV, 5E15 cm$^{-2}$ in the case of PMOS. By implanting the ions in this manner, a side wall structure with an appropriate configuration and size is formed for the three types of transistors, as illustrated in FIG. 4.

Figure 1:
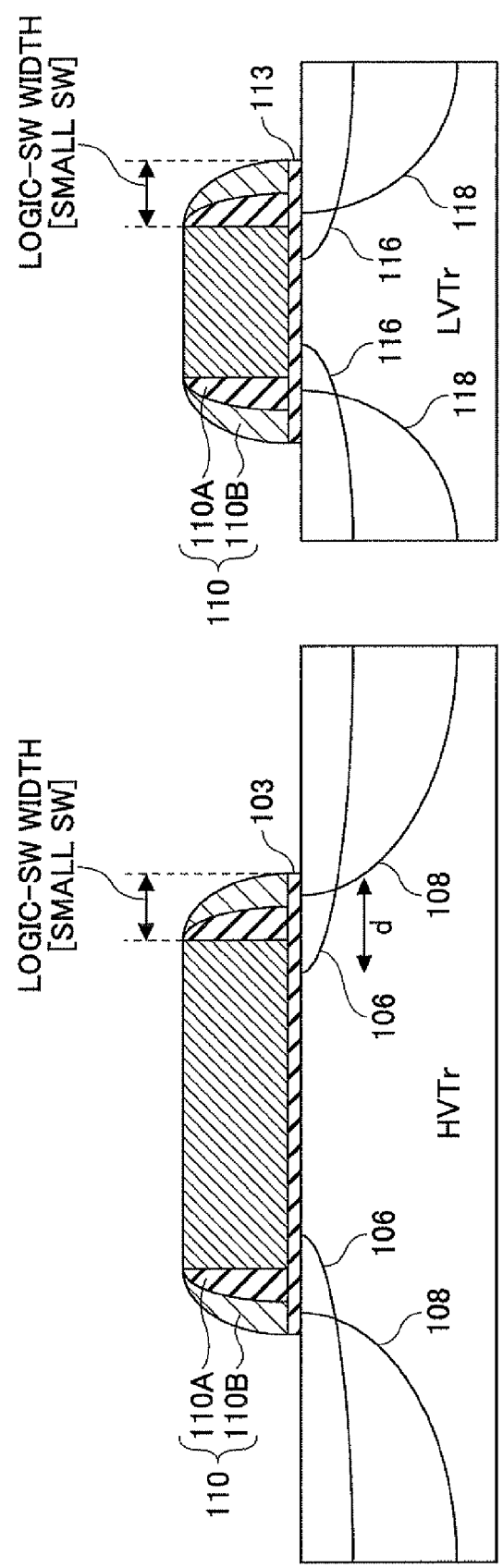
FIG. 1 is for describing problems of a conventional high voltage transistor HVTr.
Figure 2:
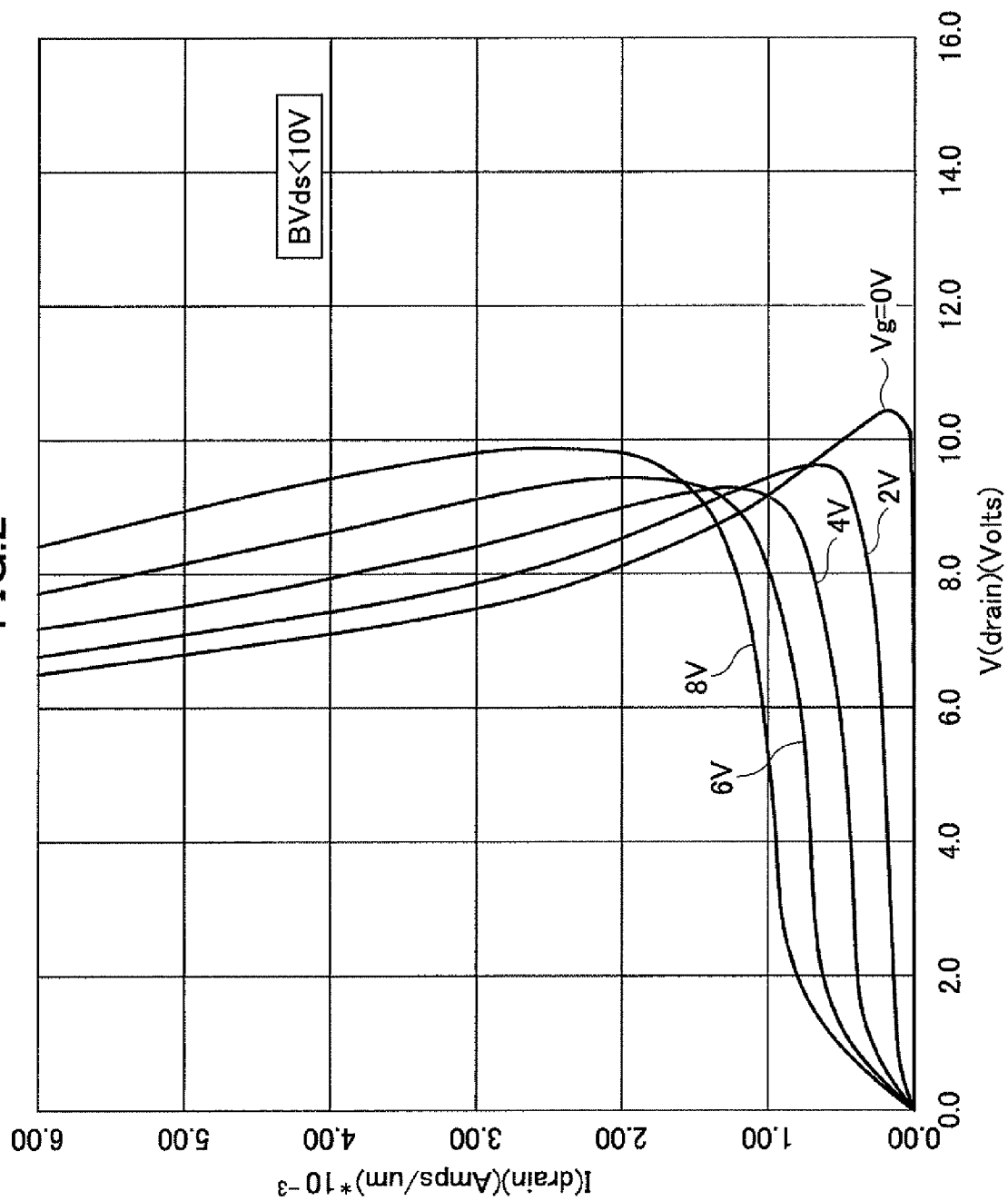
FIG. 2 is a graph indicating problems of the conventional high voltage transistor HVTr.
Figure 3:
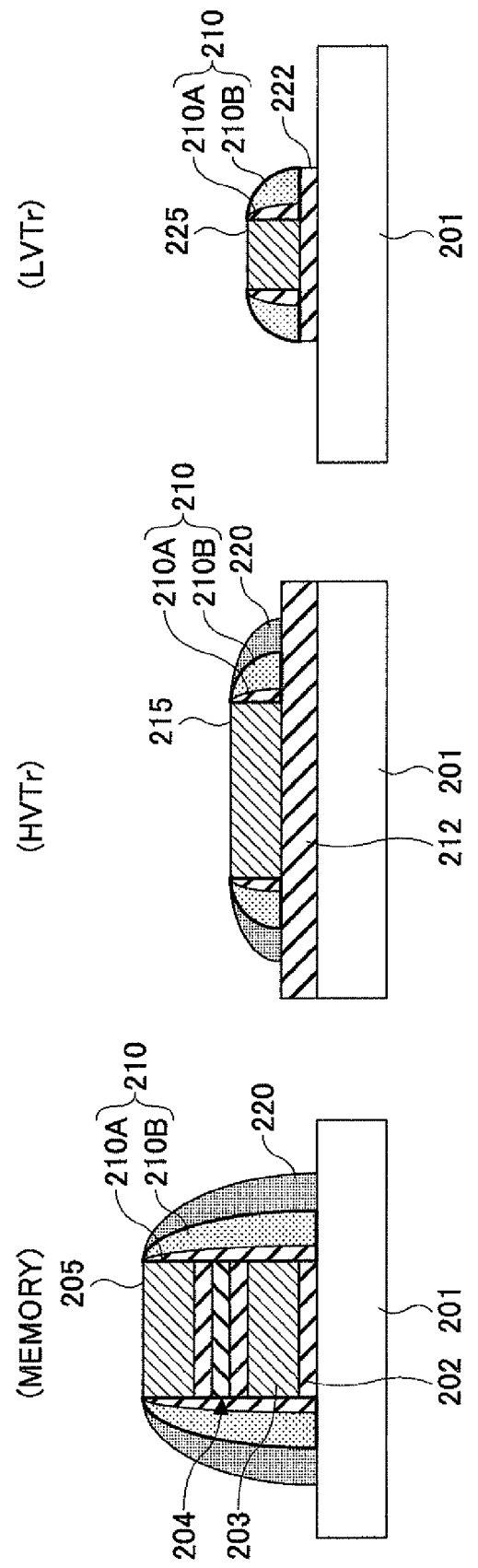
FIG. 3 is for describing a known method for solving the problems illustrated in FIGS. 1 and 2.
Figure 7:
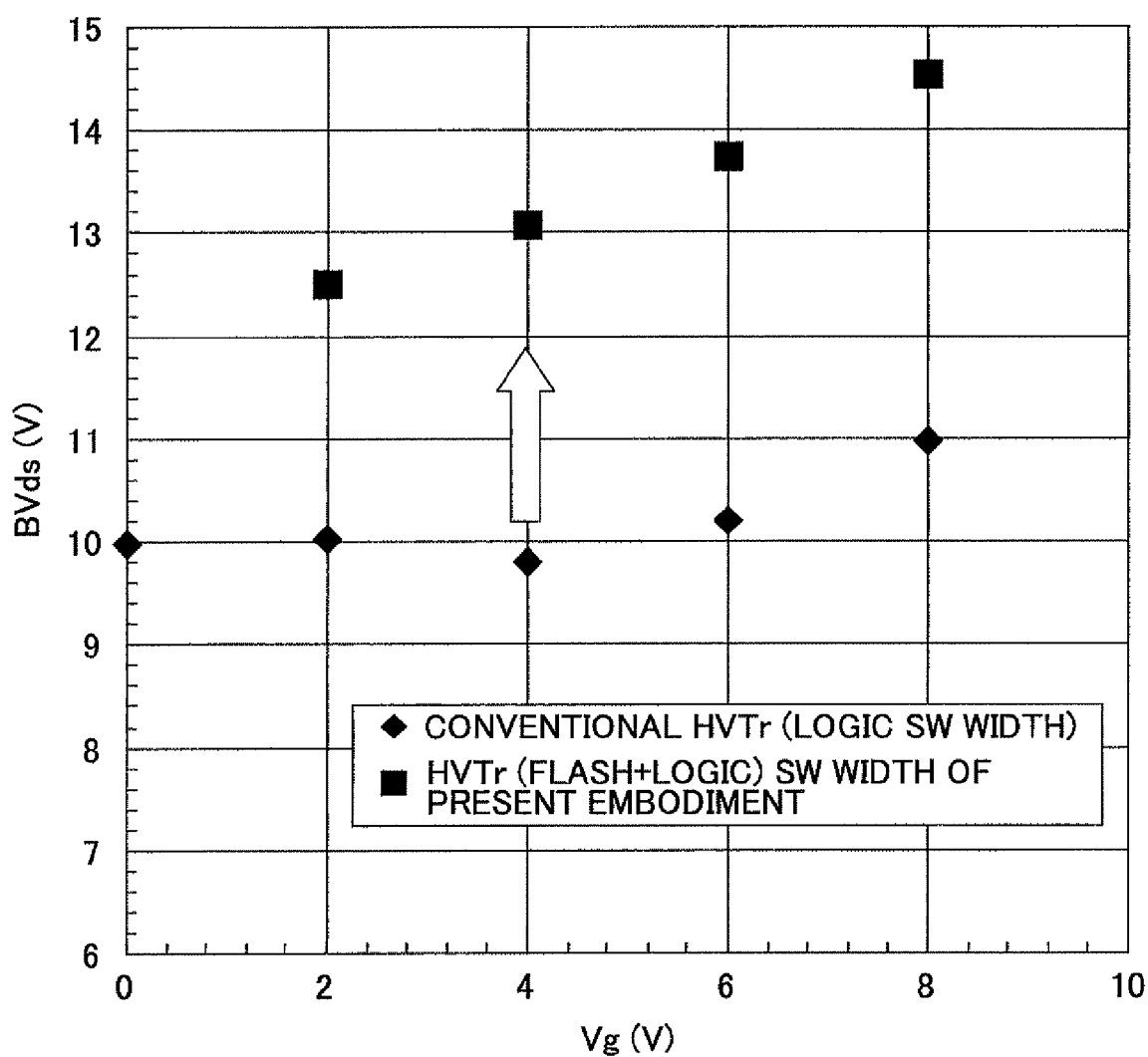
FIG. 7 is a graph illustrating effects of a semiconductor device according to an embodiment of the present invention.

FIG. 7 is a graph illustrating the snapback improvement effects of the high voltage transistor HVTr according to the semiconductor device of the present embodiment. The horizontal axis represents the gate voltage Vg (V), the vertical axis represents the insulating withstand voltage BV (V) between the source and drain, the properties of a conventional high voltage transistor HVTr having a small SW width illustrated in FIG. 1 are plotted by rhomboids, and the properties of the high voltage transistor HVTr having the side wall structure according to the embodiment illustrated in FIGS. 4 and 5 are plotted by squares. When the applied gate voltage is 2V, the insulating withstand voltage is increased by greater than or equal to 2.5 V, and when the applied gate voltage is 4V, the insulating withstand voltage is increased by greater than or equal to 3 V.

Furthermore, in the side wall structure according to the present embodiment, the first side wall 10 on the inside is a film having a high density that is formed at a high temperature, and is therefore effective in terms of improving the retention of the memory transistor (Flash).

Figure 8A:
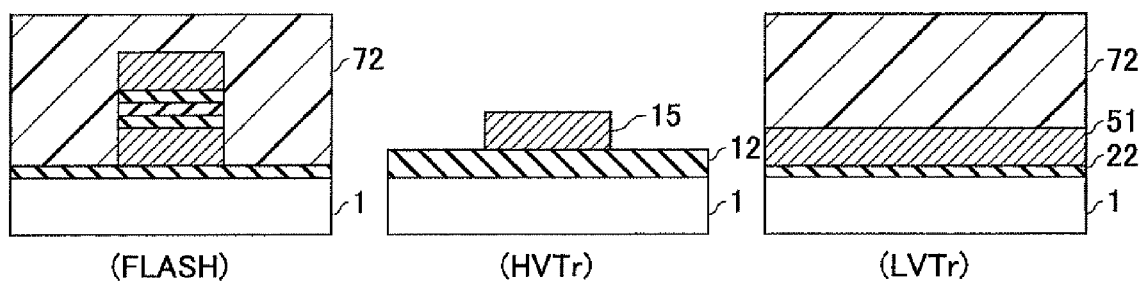
FIGS. 8A through 8D illustrate a manufacturing process of a semiconductor device according to another embodiment of the present invention.

FIGS. 8A through 8D illustrate a manufacturing process of a modification of an embodiment of the present invention. FIG. 8A illustrates the step performed after the step illustrated in FIG. 6I. The steps performed before the step of FIG. 8A are the same as those illustrated in FIGS. 6A through 6I. In the modification, before implanting the ions for source/drain extension in the memory transistor (Flash), the ions for source/drain extension are implanted in the high voltage transistor HVTr.

The mask 52 is removed after processing the flash gate 45, and the step illustrated in FIG. 8A, a mask 72 is formed such that only the region corresponding to the high voltage transistor HVTr is exposed, and an etching process is performed on the polysilicon film 51 to form the gate electrode 15 of the high voltage transistor HVTr.

Figure 8B:
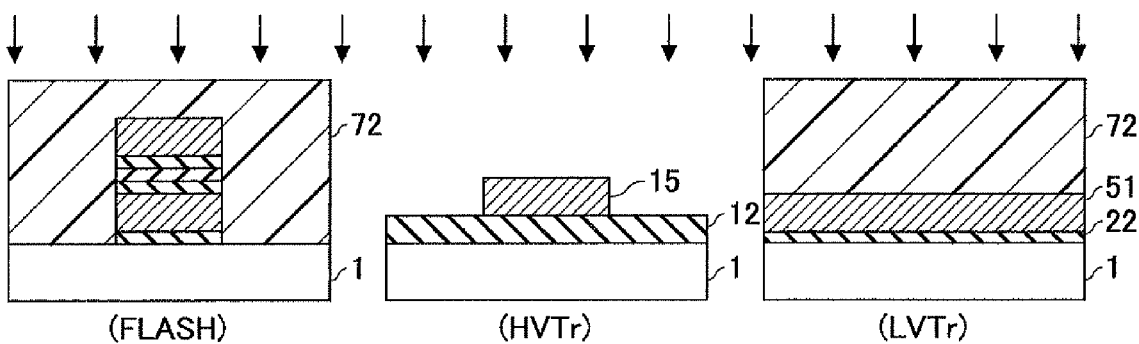

Next, as illustrated in FIG. 8B, the gate electrode 15 is used as a mask to implant ions for source/drain extension in the high voltage transistor HVTr. Phosphorus (P) is implanted by 50 keV, 4E13 cm$^{-2}$ in the case of NMOS, and boron fluoride (BF2) is implanted by 50 keV, 4E13 cm$^{-2}$ in the case of PMOS.

Figure 8C:
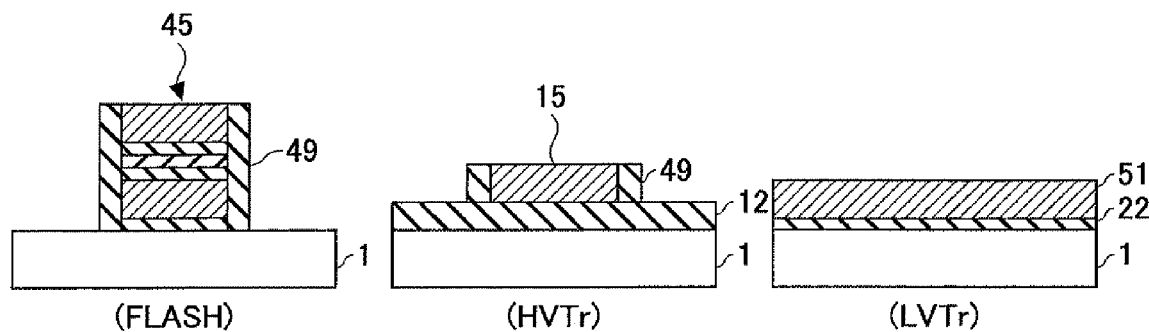

Next, as illustrated in FIG. 8C, the mask 72 is removed, and the oxidized films 49 having a thickness of 11 nm are formed on the side walls of the flash gate 45 and the gate electrode 15 of the high voltage transistor HVTr, at a temperature of 900° C. In this modification, the thermal oxidized films 49 are formed substantially simultaneously in a single process on the side walls of the flash gate 45 and the gate electrode 15 of the high voltage transistor HVTr, and therefore the final thickness of the first side wall is the same for the memory transistor (Flash) and the high voltage transistor HVTr.

Figure 8D:
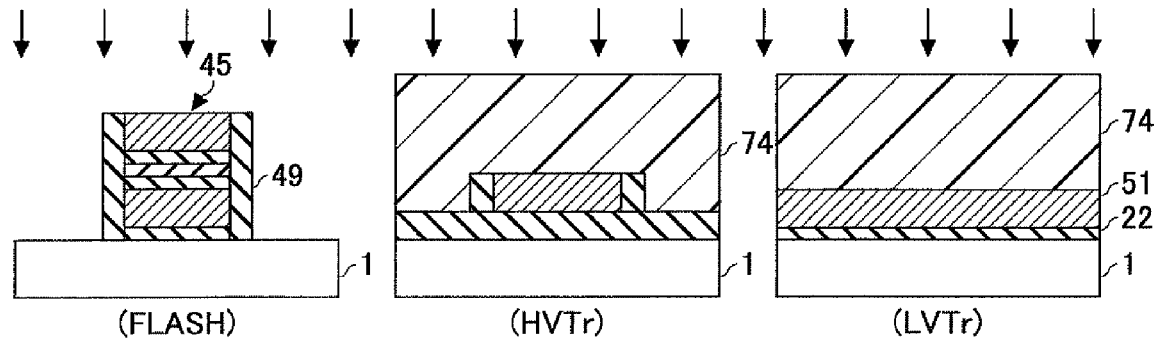

Next, as illustrated in FIG. 8D, a mask 74 is formed such that only the region corresponding to the memory transistor (Flash) is exposed, and ions for the source/drain extension of the memory transistor (Flash) are implanted. The implanting conditions are that arsenic (As) is implanted by 40 keV, 2E14 cm$^{-2}$. Subsequently, the mask 74 is removed, and the process returns to the step illustrated in FIG. 6M, where the first side walls 10M and 10H are formed substantially simultaneously in a single process on the memory transistor (Flash) and the high voltage transistor HVTr, respectively. Specifically, thermally-oxidized films having a thickness of approximately 10 nm are formed on the thermal oxidized films 49 at 900° C., thereby forming the silicon oxide films 10A. Then, the CVD-nitride films 10B having a thickness of 73 nm are formed at 800° C. Then, the CVD-nitride films 10B are etched back, so that the first side walls 10M and 10H are formed on the side walls of the flash gate 45 and the gate electrode 15 of the high voltage transistor HVTr, respectively. The difference between FIG. 8D and FIG. 6M is that in FIG. 8D, the thickness of the thermally-oxidized films 10A on the inside of the first side walls 10M and 10H is the same for the memory transistor (Flash) and the high voltage transistor HVTr. Thus, not only do the thermally-oxidized films 10A of the memory transistor (Flash) and the high voltage transistor HVTr have the same composition, but they also have the same thickness. The subsequent steps are the same as those illustrated in FIGS. 6N through 6Q.

By performing this method, the first side walls 10M and 10H that are respectively formed adjacent to the flash gate 45 and the gate electrode 15 of the high voltage transistor HVTr are films having a high density formed at high temperatures, thereby securing retention properties and intensity. Furthermore, in the memory transistor (Flash) and the high voltage transistor HVTr, the second side walls 20M and 20H are disposed on the outside of the first side walls 10M and 10H, respectively. In this manner, the width of the entire side wall is controlled, such that the concentration profile of the source/drain extension of the high voltage transistor HVTr is appropriately controlled. As a result, the snapback withstand voltage is increased.

Specific embodiments of the present invention are described above. However, the present invention is not limited to the above described examples. From the above description, variations, alternatives, and modifications may be apparent to those skilled in the art. For example, the width of the first side walls 10M and 10H may be appropriately set within a range of 75 nm through 85 nm. The width of the second side walls 20M, 20H, and 20L may be appropriately set within a range of 85 nm through 95 nm. In any case, the difference in the total side wall width (spacer width) between the high voltage transistor HVTr and the low voltage transistor LVTr corresponds to the width of the first side wall 10H.

According to an embodiment of the present invention, in a mixed type semiconductor device, the junction withstand voltage and the snapback withstand voltage on the drain side of a high-voltage operation transistor HVTr are increased. Furthermore, the electric properties of a low voltage transistor LVTr are enhanced, and data saving properties in a memory transistor are ensured.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a first transistor including a first gate side wall insulating film and a second gate side wall insulating film disposed outside of the first gate side wall insulating film;
a second transistor including a third gate side wall insulating film that has the same composition as a composition of the first gate side wall insulating film, and a fourth gate side wall insulating film that has the same composition as a composition of the second gate side wall insulating film, the fourth gate side wall insulating film being disposed outside of the third gate side wall insulating film; and
a third transistor including a fifth gate side wall insulating film that has the same composition as the composition of the second gate side wall insulating film and the fourth gate side wall insulating film, wherein
a total side wall spacer width of the third transistor is smaller than a total side wall spacer width of the second transistor by a thickness corresponding to the third gate side wall insulating film;
wherein the first transistor is a flash memory;
wherein the second transistor is configured to operate at a higher voltage than the third transistor;
wherein each of the first gate side wall insulating film and the third gate side wall insulating film contains a first silicon oxide film and a first silicon nitride film which is disposed outside of the first silicon oxide film;
wherein each of the second gate side wall insulating film, the fourth gate side wall insulating film, and the fifth gate side wall insulating film contains a second silicon oxide film and a second silicon nitride film which is disposed outside of the second silicon oxide film; and
wherein the first silicon oxide film has a higher density than the second silicon oxide film, and the first silicon nitride film has a higher density than the second silicon nitride film.

2. A semiconductor device comprising:
a first transistor including a first gate side wall insulating film and a second gate side wall insulating film disposed outside of the first gate side wall insulating film;
a second transistor including a third gate side wall insulating film that has the same composition as a composition of the first gate side wall insulating film, and a fourth gate side wall insulating film that has the same composition as a composition of the second gate side wall insulating film, the fourth gate side wall insulating film being disposed outside of the third gate side wall insulating film; and
a third transistor including a fifth gate side wall insulating film that has the same composition as the composition of the second gate side wall insulating film and the fourth gate side wall insulating film, wherein
a total side wall spacer width of the third transistor is smaller than a total side wall spacer width of the second transistor by a thickness corresponding to the third gate side wall insulating film;
wherein the first transistor is a flash memory;
wherein the second transistor is configured to operate at a higher voltage than the third transistor;
wherein each of the second gate side wall insulating film, the fourth gate side wall insulating film, and the fifth gate side wall insulating film is formed by a combination of a TEOS film and a nitride film;
wherein the nitride film is disposed outside of the TEOS film;
wherein the nitride film covers the TEOS film;
wherein each of the first gate side wall insulating film and the third gate side wall insulating film is formed by a combination of a thermally-oxidized film and a nitride film.

3. A semiconductor device comprising:
a first transistor including a first gate insulating film and a first gate side wall insulating film and a second gate side wall insulating film disposed outside of the first gate side wall insulating film;
a second transistor including a second gate insulating film and a third gate side wall insulating film that has the same composition as a composition of the first gate side wall insulating film, and a fourth gate side wall insulating film that has the same composition as a composition of the second gate side wall insulating film, the fourth gate side wall insulating film being disposed outside of the third gate side wall insulating film; and
a third transistor including a fifth gate side wall insulating film that has the same composition as the composition of the second gate side wall insulating film and the fourth gate side wall insulating film, wherein
a total side wall spacer width of the third transistor is smaller than a total side wall spacer width of the second transistor by a thickness corresponding to the third gate side wall insulating film,
wherein the first transistor is a flash memory,
wherein the second gate insulating film of the second transistor has a film thickness that is larger than a film thickness of the first gate insulating film of the first transistor,
wherein each of the second gate side wall insulating film, the fourth gate side wall insulating film, and the fifth gate side wall insulating film is formed by a combination of a TEOS film and a nitride film,
wherein the nitride film is disposed outside of the TEOS film; and
wherein the nitride film covers the TEOS film;
wherein each of the first gate side wall insulating film and the third gate side wall insulating film is formed by a combination of a thermally-oxidized film and a nitride film.

* * * * *